United States Patent [19]

Wecker

[11] Patent Number: 5,779,817

[45] Date of Patent: Jul. 14, 1998

[54] CIRCUIT ARRANGEMENT OF SOLAR CELLS

[75] Inventor: Reinhard Wecker, Eichenau, Germany

[73] Assignee: Webasto-Schade GmbH, Stockdorf, Germany

[21] Appl. No.: 655,814

[22] Filed: May 31, 1996

[30] Foreign Application Priority Data

Jun. 30, 1995 [DE] Germany ............... 195 23 904.0
Jul. 28, 1995 [DE] Germany ............... 195 27 740.6

[51] Int. Cl.$^6$ ............................................. H01L 31/042
[52] U.S. Cl. ..................... 136/293; 136/244; 323/906; 320/2; 388/933; 454/900
[58] Field of Search .................... 136/244, 293; 323/906; 320/2; 388/933; 454/900

[56] References Cited

U.S. PATENT DOCUMENTS

| | | | |
|---|---|---|---|
| 4,551,669 | 11/1985 | Itoh et al. | 323/268 |
| 5,213,626 | 5/1993 | Paetz | 136/244 |
| 5,514,223 | 5/1996 | Vogels | 136/244 |

FOREIGN PATENT DOCUMENTS

| | | | |
|---|---|---|---|
| 53-25388 | 3/1978 | Japan | 136/293 |
| 58-23488 | 2/1983 | Japan | 136/293 |

*Primary Examiner*—Nam Nguyen
*Attorney, Agent, or Firm*—Sixbey, Friedman, Leedom & Ferguson; David S. Safran

[57] ABSTRACT

A circuit arrangement with a first string of solar cells which are connected together in series and a second string of solar cells which are connected together in series, the electric power generated by the solar cells being used to operate an ohmic or inductive load. In contrast to known circuits, in which series-connected strings of solar cells are connected in parallel and have roughly identical no-load voltages, it is provided according to the invention that the strings of series-connected solar cells generate different no-load voltages to adapt to the current/voltage characteristic of the load. Preferably, at least one reverse-current blocking diode is connected in series with the string which generates a lower no-load voltage than the other. The series connection with a lower no-load voltage can be selectively formed with solar cells of the same no-load voltage by a smaller number of solar cells, or with solar cells of different power by the same number of solar cells with a lower no-load voltage. Furthermore, in one embodiment, the circuit arrangement is constructed for selective operation of a fan arrangement or for charging a battery by switching several strings of solar cells from a parallel interconnection to a series interconnection.

18 Claims, 4 Drawing Sheets

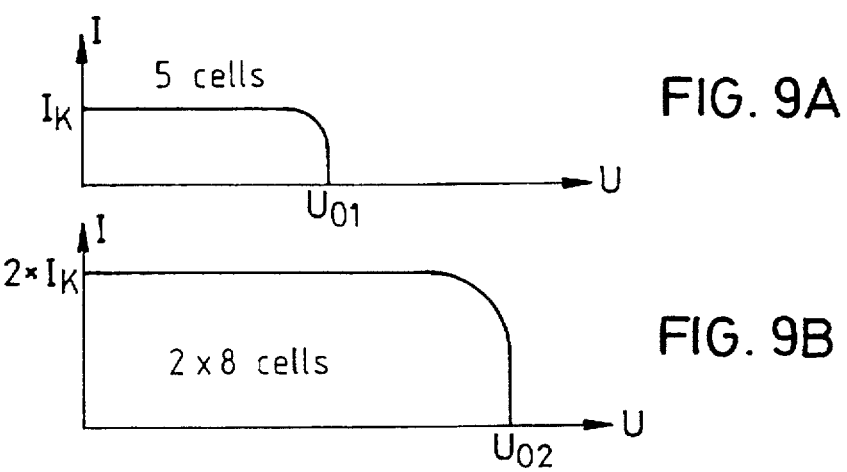
FIG. 9A
FIG. 9B
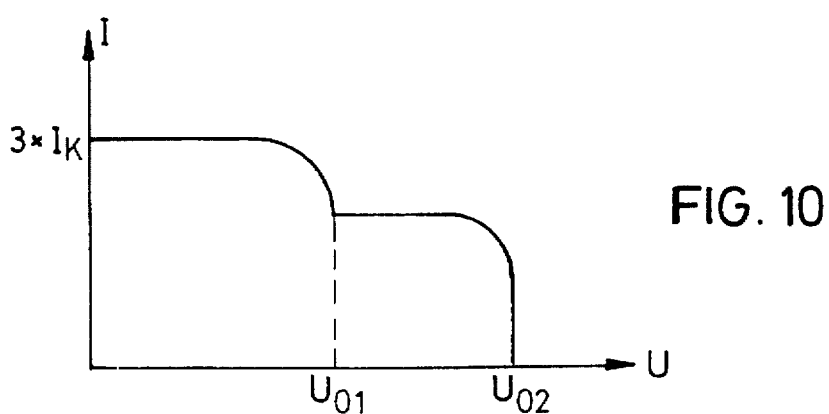
FIG. 10
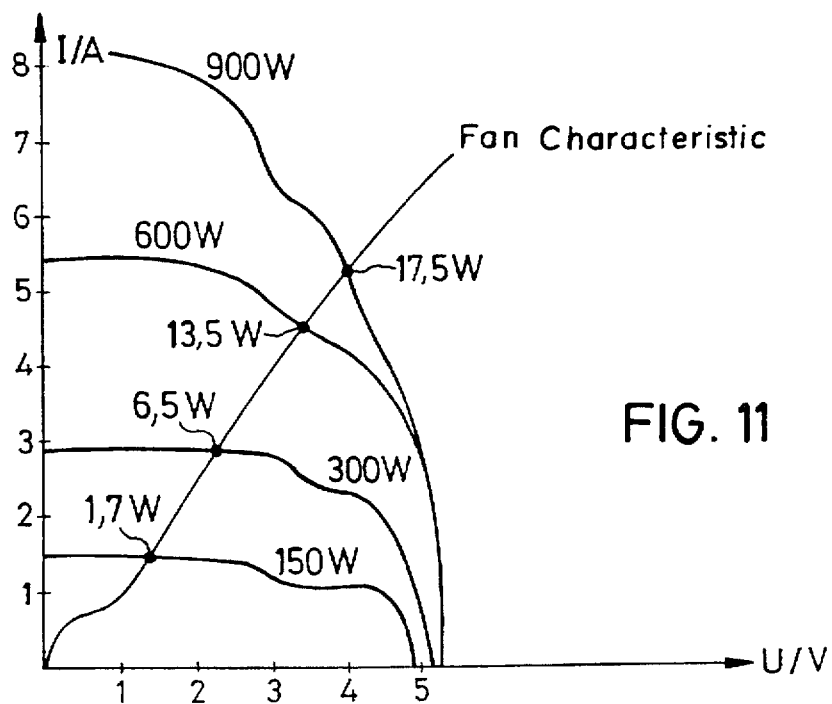
FIG. 11

CIRCUIT ARRANGEMENT OF SOLAR CELLS

BACKGROUND OF THE INVENTION

1. Field of the Invention

The invention relates to a circuit arrangement with a first series connection of solar cells and at least one second series connection of solar cells connected in parallel thereto, the electric power generated by the solar cells being used to operate an ohmic or inductive load.

2. Description of Related Art

A circuit of this type is known from U.S. Pat. No. 5,213,626 for producing a solar current in a sliding roof cover for operation of a vehicle fan. Here, the first of the series connections is formed of solar cells with crystalline semiconductor material and the second series connection is made of solar cells with amorphous semiconductor material. Both groups are designed such that the voltage generated in them is at least roughly the same. The no-load voltages of the solar cells are in the range from 0.4 to 0.6 volts. Many solar cells are connected in succession in order to make the voltage as uniform as possible. To generate higher currents the two series connections are then connected by a parallel circuit.

In known circuit arrangements, it is disadvantageous that they cannot be optimally adapted to ohmic or inductive loads. Especially in the operation of DC motors, the problem is that either the electric power which can be produced by the solar cells, as a whole, must be so high that they can provide the increased starting current required for this type electric motor even with low incident solar radiation, or otherwise it must be accepted that the motor can only be started when near the maximum incident solar radiation acts on the solar cells. Attempts have been made to remedy this problem in the past by using so-called DC/DC converters in which, by means of expensive electronic circuits, the maximum power point is shifted to a lower voltage. These electronic circuits, however, are relatively expensive, on the one hand, and in addition, themselves consume some of the electric power generated by the solar cells.

SUMMARY OF THE INVENTION

The object of the invention is to devise a circuit arrangement which allows, using simple means, optimum adaptation of the electric power generated by the solar cells to the power required by an ohmic or inductive consumer.

According to preferred embodiments of the invention, this object is achieved by designing each of the series connections to adapt to the current/voltage characteristic of the load at a different no-load voltage which can be generated.

Because the no-load voltage which can be generated in the individual series connections is intentionally designed to be different, the series connections of solar cells, which are also called strings and are protected with a lower no-load voltage, preferably, by reverse-current blocking diodes, by parallel connection of these strings with different no-load voltage, a power characteristic of the entire circuit arrangement is formed which can be very effectively approximated to the ohmic or inductive consumer. The power drop on the optionally present blocking diodes is thus much lower than the power loss caused by using a DC/DC converter. By abandoning these DC/DC converters, the costs for a circuit which is located, for example, in the cover of a sliding and lifting roof to generate solar current can be significantly reduced.

For this circuit arrangement, various alternatives are available. Thus, according to one embodiment, each of the series connections can be composed of the same numbers of solar cells, the solar cells of the first series connection each having a lower no-load voltage than that of the second series connection.

According to another alternative embodiment, the series connections can be composed of different numbers of solar cells with the same no-load voltage. Finally, mixed forms are also conceivable in which, consequently, all the noload voltage which arises in one series connection differs significantly from that of other series connections.

Regardless of the composition of the individual series connections, it is advantageous for simultaneous use of the circuit arrangement for operation of an ohmic or inductive load, or for charging a battery, if the arrangement has a transfer switch by which all series connections, for their part, can be switched in series. This series connection of all individual strings of solar cells takes into account the circumstance that a battery, in a wide power range from about 10% to 100% charge, operates at roughly the identical voltage, so that no adaptation of the voltage characteristic is necessary in this case.

According to one advantageous application, it is provided that the circuit arrangement with its solar cells is located in the area of the cover of an openable vehicle roof and that the load is formed by a motor of a fan located in the vehicle.

In this application of the solar cell circuit arrangement, the division of this cover into amorphous solar cells which are located in the central area of the cover and into crystalline solar cells which are located in an opaque edge area which covers the cover mechanism, which is known from the initially mentioned prior art, can be feasibly combined to advantage with its different no-load voltages.

To minimize the power losses, it is advantageous if the reverse current blocking diode(s) is/are formed by a Schottky diode.

In the following one embodiment of the invention is explained using the drawing and is compared to the disadvantages in the prior art.

BRIEF DESCRIPTION OF THE DRAWINGS

FIGS. 9a and 9b show the current/voltage characteristic of three strings with differing no-load voltages;

FIG. 10 shows the current/voltage characteristic of three strings connected in parallel;

FIG. 11 shows the current/load characteristic of a circuit arrangement according to the invention compared to the characteristics of a fan motor.

DETAILED DESCRIPTION OF THE PREFERRED EMBODIMENTS

Figure 1:
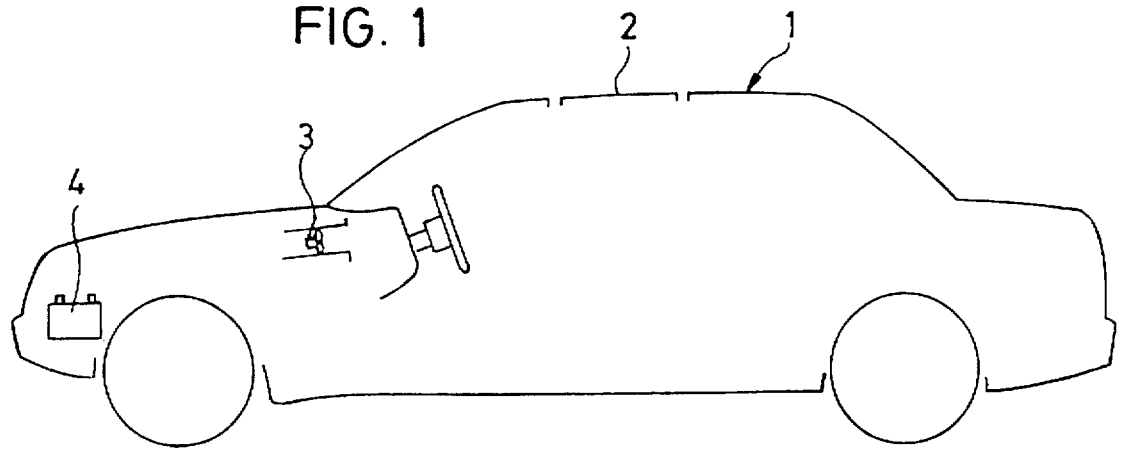
FIG. 1 schematically depicts a vehicle to which the invention is applicable.

In FIG. 1, a vehicle roof 1 is provided with a movable cover 2 which selectively closes and at least partially exposes an opening in roof 1. Furthermore, the vehicle is equipped, in a conventional manner, with a fan 3 for supplying fresh air to, and/or circulating air within, the vehicle interior and with a battery 4.

Figure 2:
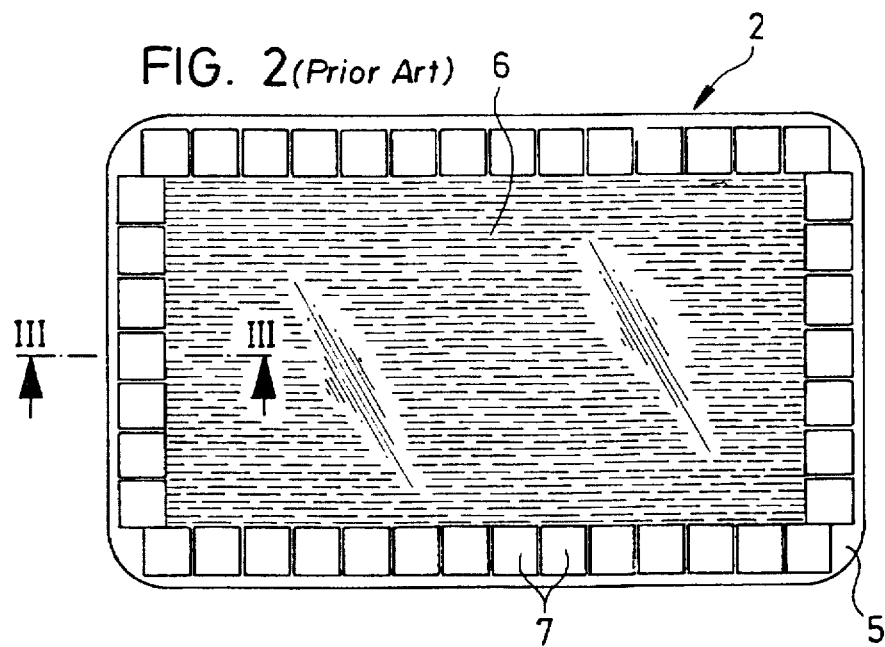
FIG. 2 shows a plan view of a movable cover of the FIG. 1 vehicle roof.

As FIG. 2 shows, cover 2 is made as a solar glass cover, and comprises a peripheral edge area 5 and a central area 6 surrounded by it. Under edge area 5, there are sheet metal parts, such as the inner sheet metal of the cover, and possibly links, all of which are conventionally necessary to control the motion mechanism of cover 2, so that edge area 5 is preferably kept opaque from the top. For this reason, the solar cells located in edge area 5 are made as crystalline solar cells 7. Conversely, in central area 6 of cover 2, transparency of cover 2 is desirable, for which reason amorphous solar cells 8 are used here.

Figure 3:
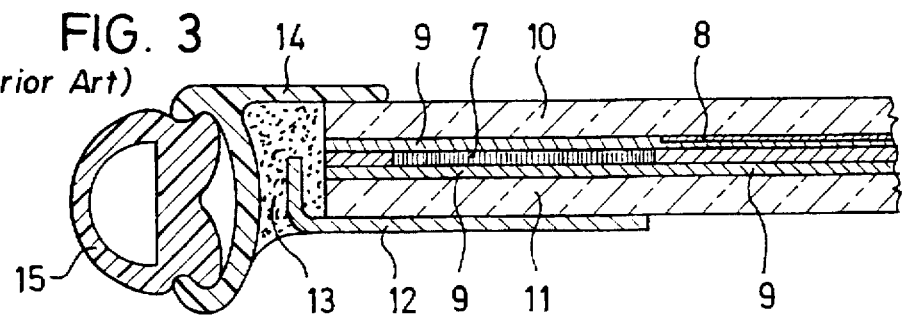
FIG. 3 is a section taken along line III—III of FIG. 2 showing an edge area of the cover on an enlarged scale.

As the partial section according to FIG. 3 illustrates, cover 2 is composed of upper panel 10 and lower panel 11, between which crystalline solar cells 7 in edge area 5 or amorphous solar cells 8 in central area 6 are embedded by means of adhesive films 9. An inner frame 12 of cover 2 is used to reinforce the cover in the edge area and is attached to cover 2 by means of a plastic sealing compound 13 in the same manner as a plastic frame 14 which surrounds cover 2 on the periphery. A groove which runs peripherally on the outside of plastic frame 14 is used to hold seal 15.

To the extent described so far, cover 2 conforms with that disclosed in the initially-mentioned U.S. Pat. No. 5,213,626.

Figure 4:
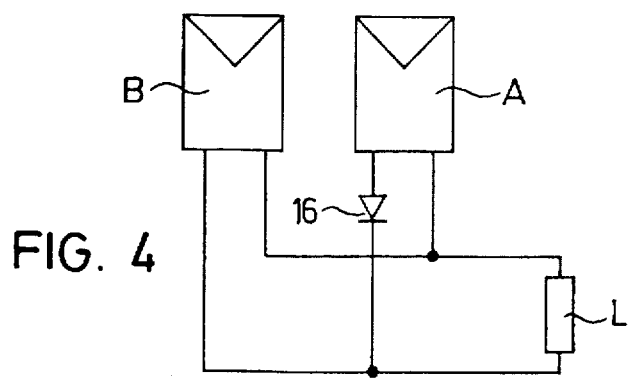
FIG. 4 is a schematic of a circuit arrangement according to the invention.

In FIG. 4, two different arrays or strings of solar cells are represented as a series connection A and B. Series connection A has a different no-load voltage $U_0$ than series connection B, and the series connections A and B are connected in parallel to an ohmic and/or inductive load L. Each string A or B is, itself, made of a plurality of solar cells 8 and 7 which are connected in series. In the example according to FIG. 4, the string or first series connection A is formed of the amorphous solar cells 8 of cover 2. The other string or second series connection B is formed of the crystalline solar cells 7 in edge area 5 of cover 2. A roughly identical number of solar cells 8 or 7 is assumed, so that the string or first series connection A, due to lower no-load voltage $U_0$ of amorphous solar cells 8, as a whole, also makes available a lower no-load voltage $U_0$ than the string B which is composed of more efficient crystalline solar cells 7. First series connection A is protected in the current direction to the point of common coupling of the parallel connection by reverse current blocking diode 16, which is preferably made as a Schottky diode. Use of reverse current blocking diodes 16 can be abandoned under certain circumstances if, as a result of the characteristics of the individual series connections, only minimal or no reverse currents in the area of the working point of the ohmic or inductive load L occur. The load L is formed by the motor of a fan 3.

Figure 5:
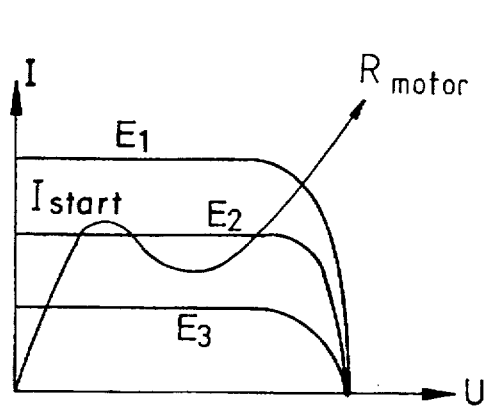
FIG. 5 shows a current/voltage diagram of a known parallel connection of strings of the same no-load voltage.
Figure 6:
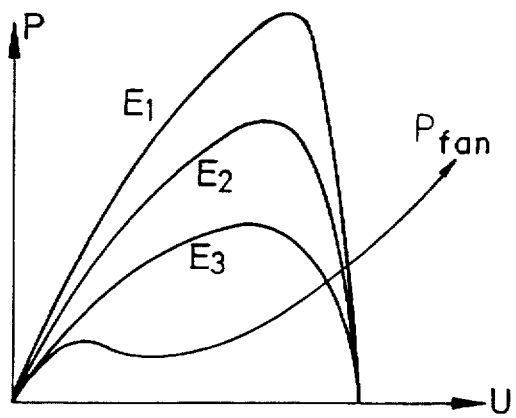
FIG. 6 shows a power curve of a known parallel connection of strings of the same no-load voltage.

In the current/voltage diagram according to FIG. 5, on the one hand, the characteristic of the motor used for fan 3, and on the other, the characteristic of a conventional parallel connection of strings of the same noload voltage are compared. This comparison indicates that, as a result of the required relatively high starting current $I_{START}$ of the motor for lower incident solar energy $E_3$, or also next higher incident radiation $E_2$, the motor would not start. Only at maximum incident radiation E1 is the required starting current provided by this parallel connection of strings. This has the disadvantage that the power generated by the solar cells of a sliding roof cover, in the case of the desired stationary venting of a vehicle, for example, with cover 2 raised, leads to a venting effect for the vehicle interior only with maximum incident solar radiation. To counteract this, in a different layout which is shown in FIG. 6, this ratio of powers of the solar cells used and the characteristic of a fan motor were selected such that the starting current of the fan motor is already overcome at a relatively low incident radiation density $E_3$. This, in turn however, has the disadvantage that, for maximum incident radiation $E_1$, a large part of the power produced is wasted, since it cannot be used or the fan motor would be overloaded in the case of the lack of protective measures and could be damaged.

Figure 7:
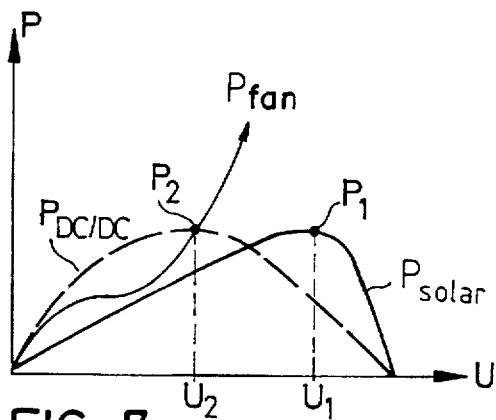
FIG. 7 shows a power curve of a known circuit arrangement equipped with a DC/DC converter.

In another known arrangement according to FIG. 7, the attempt is made to shift the power peak of a solar cell circuit from point $P_1$, with the greater voltage $U_1$ assigned there, to point $P_2$ with a correspondingly lower voltage $U_2$ by using a DC/DC converter. By means of this shift, the starting current of a fan motor can be overcome even at an lower incident radiation density and maximum power $P_2$ of the solar cells can still be used to operate the fan. These DC/DC converters, however, have the disadvantage that they are relatively expensive with a unit price of roughly 50 DM ($33.60) per sliding roof cover, and that, on the other hand, they consume some of the generated solar power themselves.

Figure 8:
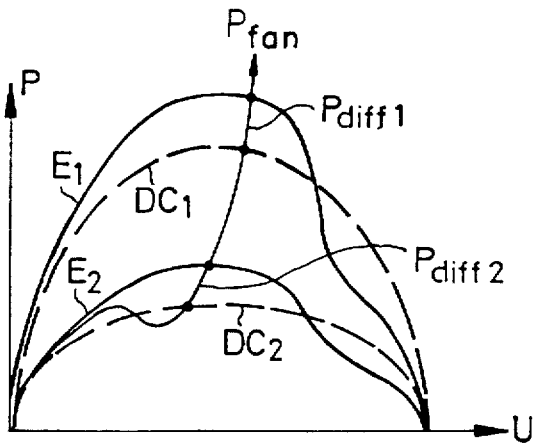
FIG. 8 shows the power characteristics of a circuit arrangement according to the invention compared to a circuit equipped with a DC/DC converter.

In the power/voltage diagram of FIG. 8, the asymmetrical configuration according to the invention is compared to a conventional circuit equipped with a DC/DC converter. This shows that, at a lower incident solar radiation intensity $E_2$, due to the power consumption of the DC/DC converter, the power curve $DC_2$ is not enough to provide the starting current of the fan motor. Conversely, the curve which is above this curve and which corresponds to the power of an asymmetrical parallel connection of solar cells according to the invention, has a power higher by amount $Pdiff_2$ which is sufficient for starting the fan motor. At maximum incident radiation density $E_1$, in the upper part of FIG. 8, it likewise becomes clear that the curve at the very top which corresponds to the power of the asymmetrical parallel connection of solar cells according to the invention enables a higher fan power than curve $DC_1$ which is underneath due to the power consumption of the DC/DC converter. The difference amount of the power in favor of the circuit according to the invention is designated $Pdiff_1$.

As already indicated initially, the invention can be implemented in several ways. Thus, first series connection A with the lower no-load voltage $U_0$, at the same no-load voltage of the individual cells, can be produced by a smaller number of series connected cells, or at a different cell voltage also by the same number of cells, as is used in second series connection B. In between, mixed forms are also conceivable in which one of at least two series connections or strings always has a significantly lower no-load voltage $U_0$. FIGS. 9A and 9B show current/voltage diagrams of an embodiment in which solar cells of the same no-load voltage are interconnected in string A, according to FIG. 9A, into a first series connection of five cells. As represented in FIG. 9B, a second series connection B is formed by a series connection of two out of eight series connected cells of the same no-load voltage. If these two strings A and B from FIGS. 9A and 9B are interconnected by a parallel connection, a current/voltage characteristic according to FIG. 10 arises. As FIG.

11 shows, this asymmetrical parallel connection of strings of different no-load voltage is best suited to adapting the power made available by the solar cells at different incident radiation intensity to a fan characteristic in an almost ideal manner. For this reason, any numbers of series connections can be combined into a parallel connection. Thus, the invention is not limited to the parallel connection of only two series connections A or B described so far.

Figure 12:
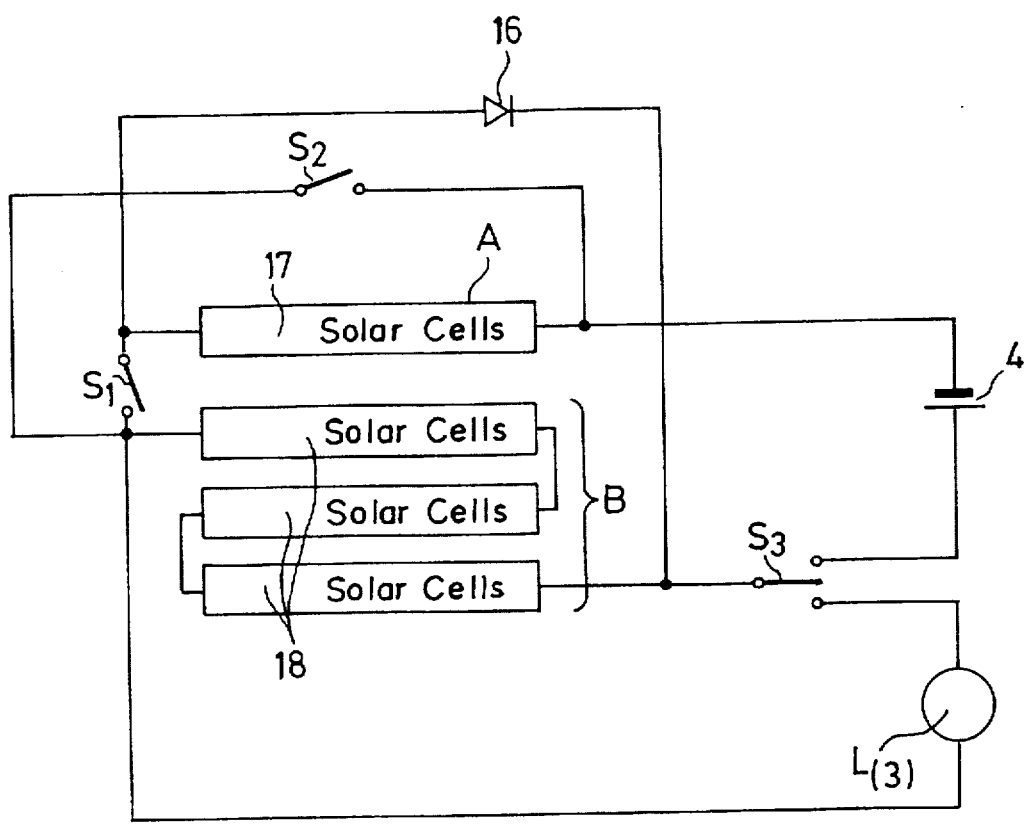
FIG. 12 shows a circuit arrangement with a transfer switch for a series connection of all strings.

In the embodiment according to FIG. 12, there, a string 17 is formed of nine solar cells connected in series as first series connection A and a second series connection B is comprised of three strings 18, each of which is formed of nine series-connected solar cells. Both of these connections can be used, selectively, for operation of ohmic and/or inductive load L, as, for example, of the motor of the fan 3, or for charging of a vehicle battery 4 by means of switches $S_1$, $S_2$ and $S_3$. To operate the fan 3, i.e., load L, switch $S_1$, 1 is open and switch $S_2$ is closed. Switch $S_3$, which is made as a transfer switch, is at the connection terminal of load L. In this way, series connections A and B are interconnected in the form of a parallel connection which, in the above described advantageous manner, can be used to adapt to the characteristic of load L for its optimum operation.

If, conversely, vehicle battery 4 is to be charged, switch $S_1$ is closed and switch $S_2$ is opened and transfer switch $S_3$ is placed on the connection terminal of battery 4. In this way, two series connections A and B are combined with all four strings 17 and 18, formed of nine solar cells each, in the form of a series connection and produce a constantly high voltage which is necessary for charging of battery 4.

Of course switches $S_1$, $S_2$, and $S_3$ can be made in the form of a single switching element, or also as a relay which can be actuated depending on the charging state of battery 4.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

We claim:

1. A circuit arrangement comprising:
   first string of solar cells which are connected together in series; and
   at least one second string of solar cells which are connected together in series, the first and second strings being connected in parallel to an ohmic or inductive load as a means for supplying electric power generated by the solar cells thereto for operation thereof;
   wherein the first string forms a means for generating a first no-load voltage and the second string forms a means for generating a second no-load voltage [that is significantly] different from said first no-load voltage for adapting the electric power generated by the solar cells to changing current/voltage characteristics of the load, and
   wherein one of the first and second no-load voltages is at least approximately 60 percent greater than the other of said no load voltages.

2. Circuit arrangement according to claim 1, wherein at least one reverse-current blocking diode is connected in series with a one of said strings which generates a lower no-load voltage than the other.

3. Circuit according to claim 2, wherein each of said strings is composed of the same numbers of solar cells, each of the solar cells of the first string having a lower no-load voltage than that of the solar cells of the second string.

4. Circuit arrangement according to claim 2, wherein each of said strings is composed of different numbers of solar cells, each solar cell having the same no-load voltage.

5. Circuit arrangement according to claim 2, wherein reverse-current blocking diode is a Schottky diode.

6. Circuit arrangement according to claim 1, further comprising a transfer switching means for switching the strings from said parallel connection into a series connection for producing a higher voltage.

7. Circuit arrangement according to claim 6, wherein the solar cells are located in an area of a cover of an openable vehicle roof; and wherein the load is formed by a motor of a fan located in a vehicle.

8. Circuit arrangement according to claim 7, wherein one of the first and second no-load voltages is at least approximately 60 percent greater than the other of the first and second no-load voltages, and wherein the load formed by the fan motor changes by at least approximately a factor of 10.

9. Circuit arrangement according to claim 7, wherein said series connection is connected to a battery located in the vehicle for charging thereof.

10. Circuit arrangement according to claims 9, wherein the solar cells of the first string are amorphous solar cells which are located in a central area of the cover; and wherein the solar cells of the second string are crystalline solar cells which are located in edge area of cover.

11. Circuit according to claim 10, wherein each of said strings is composed of the same numbers of solar cells, each of the solar cells of the first string having a lower no-load voltage than that of the solar cells of the second string.

12. Circuit arrangement according to claim 9, wherein the solar cells of the first string are amorphous solar cells which are located in a central area of the cover; and wherein the solar cells of the second string are crystalline solar cells which are located in edge area of cover.

13. Circuit according to claim 9, wherein each of said strings is composed of the same numbers of solar cells, each of the solar cells of the first string having a lower no-load voltage than that of the solar cells of the second string.

14. Circuit arrangement according to claim 9, wherein each of said strings is composed of different numbers of solar cells, each solar cell having the same no-load voltage.

15. Circuit according to claim 1, wherein each of said strings is composed of the same numbers of solar cells, each of the solar cells of the first string having a lower no-load voltage than that of the solar cells of the second string.

16. Circuit arrangement according to claim 1, wherein each of said strings is composed of different numbers of solar cells, each solar cell having the same no-load voltage.

17. Circuit arrangement according to claim 1, wherein one of the first and second no-load voltages is approximately three times greater than the other of said no load voltages.

18. A circuit arrangement comprising:
   a first string of solar cells which are connected together in series;
   at least one second string of solar cells which are connected together in series the first and second strings being located in an area of a cover of an openable vehicle roof and connected in parallel to a load formed by a motor of a fan located in the vehicle as a means for supplying electric power generated by the solar cells thereto for operation thereof;
   wherein the first string forms a means for generating a first no-load voltage and the second string forms a means for generating a second no-load voltage different from said first no-load voltage for adapting the electric power generated by the solar cells to changing current/voltage characteristics of the load.

* * * * *